(12) United States Patent
Du et al.

(10) Patent No.: US 9,620,728 B2
(45) Date of Patent: Apr. 11, 2017

(54) CNT THIN FILM TRANSISTOR WITH HIGH K POLYMERIC DIELECTRIC

(71) Applicant: National Research Council of Canada, Ottawa (CA)

(72) Inventors: Naiying Du, Ottawa (CA); Patrick Malenfant, Ottawa (CA); Zhao Li, Ottawa (CA); Jacques Lefebvre, Gatineau (CA); Girjesh Dubey, Stuttgart (DE); Gregory Lopinski, Ottawa (CA); Shan Zou, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 14/609,806

(22) Filed: Jan. 30, 2015

(65) Prior Publication Data
US 2015/0214496 A1    Jul. 30, 2015

(30) Foreign Application Priority Data
Jan. 30, 2014    (EP) .................................... 14153150

(51) Int. Cl.
  *H01L 29/06*    (2006.01)
  *H01L 51/05*    (2006.01)
  *H01L 51/00*    (2006.01)

(52) U.S. Cl.
  CPC ...... *H01L 51/0558* (2013.01); *H01L 51/0035* (2013.01); *H01L 51/0048* (2013.01);
  (Continued)

(58) Field of Classification Search
  CPC .................... H01L 51/0529; H01L 51/0048
  See application file for complete search history.

(56) References Cited

U.S. PATENT DOCUMENTS

| | | |
|---|---|---|
| 4,322,524 A | 3/1982 | Onda et al. |
| 4,843,517 A | 6/1989 | Maruyama et al. |

(Continued)

FOREIGN PATENT DOCUMENTS

| | | |
|---|---|---|
| KR | 2010-0138078 | 12/2010 |

OTHER PUBLICATIONS

Xu, Wentao, Shi-Woo Rhee, Organic field-effect transistors with cross-linked high-k cyanoethylated pullulan polymer as a gate insulator, Organic Electronics, vol. 11, Issue 6, Jun. 2010, pp. 996-1004.*

(Continued)

*Primary Examiner* — Thao X Le
*Assistant Examiner* — Laura Dykes
(74) *Attorney, Agent, or Firm* — Catherine Lemay

(57) ABSTRACT

A thin film transistor (TFT) has a gate electrode; a gate insulation layer, a semiconducting channel separated from the gate electrode by the gate insulation layer; a source electrode and a drain electrode. The gate insulation layer is a cross-linked cyanoethylated polyhydroxy polymer, e.g. a cross-linked cyanoethylated pullulan, having a high dielectric constant and the semiconducting channel has a network of semiconducting carbon nanotubes. The semiconducting channel is adhered to the gate insulation layer through a polymeric material. The carbon nanotubes adhere to the polymeric material and the polymeric material reacts or interacts with the gate insulation layer. TFTs have high mobilities while maintaining good on/off ratios.

17 Claims, 7 Drawing Sheets

(52) U.S. Cl.
CPC ........ *H01L 51/052* (2013.01); *H01L 51/0529* (2013.01); *H01L 51/0039* (2013.01); *H01L 51/0516* (2013.01)

(56) References Cited

U.S. PATENT DOCUMENTS

| | | | |
|---|---|---|---|
| 7,037,767 | B2 | 5/2006 | Hirai et al. |
| 7,256,436 | B2 | 8/2007 | Fukui et al. |
| 7,537,975 | B2 | 5/2009 | Moon et al. |
| 8,330,194 | B2 | 12/2012 | Sato et al. |
| 8,580,384 | B2 | 11/2013 | Zheng et al. |
| 2005/0186700 | A1* | 8/2005 | Klauk .................... B82Y 10/00 438/99 |
| 2006/0147700 | A1* | 7/2006 | Papakostas .............. G01D 5/16 428/323 |
| 2006/0240605 | A1 | 10/2006 | Moon |
| 2009/0026926 | A1* | 1/2009 | Shirata .............. H01L 31/02246 313/504 |
| 2009/0189148 | A1 | 7/2009 | Araumi et al. |
| 2009/0272967 | A1* | 11/2009 | Afzali-Ardakani .... B82Y 10/00 257/40 |
| 2011/0075320 | A1 | 3/2011 | Fang et al. |
| 2011/0309336 | A1 | 12/2011 | Shin et al. |
| 2012/0167799 | A1 | 7/2012 | Bae et al. |
| 2012/0248416 | A1 | 10/2012 | Zhou |

OTHER PUBLICATIONS

Lin, Debora W. Christopher J. Bettinger, Joshua P. Ferreira, Clifford L. Wang, and Zhenan Bao. A Cell-Compatible Conductive Film from a Carbon Nanotube Network Adsorbed on Poly-L-lysine. ACS Nano, vol. 5, Issue 12, pp. 10026-10032.*
English Abstract of KR 2010-0138078.
Aguirre CM, et al. (2009) The Role of the Oxygen/Water Redox Couple in Suppressing Electron Conduction in Field-Effect Transistors. Adv. Mater. 21, 3087-3091.
Cao Q, et al. (2008) Medium scale carbon nanotube integrated circuits on flexible plastic substrates. Nature. 454, 495-500.
Cao Q, Rogers JA. (2009) Ultrathin films of single wall carbon nanotubes for electronics and sensors: A review of fundamental and applied aspects. Adv. Mater. 21, 29-53.
Ding J, et al. (2014) Enrichment of large-diameter semiconducting SWCNTs by polyfluorene extraction for high network density thin film transistors Nanoscale 6, 2328-2339.
Gerstel P, et al. (2014) Highly Selective Dispersion of Single-Walled Carbon Nanotubes via Polymer Wrapping: A Combinatorial Study via Modular Conjugation. ACS Macro Lett. 3, 10-15, dx.doi. org/10.1021/mz400472q.
Ha M, et al. (2010) Printed, sub-3V digital circuits on plastic from aqueous carbon nanotube inks. ACS Nano. 4388-4395.
Ha M, et al. (2013) Aerosol jet printed, low voltage, electrolyte gated carbon nanotube ring oscillators with sub- 5µs stage delays. Nano Lett. 13, 954-960.
Hur, SH. et al. (2010) Optimization of single wall carbon nanotube growth and study of the hysteresis of random network carbon nanotube thin film transistors. Korean J. Chem Eng. 27, 1892-1896.
Jin SH, et al. (2012) Sources of hysteresis in carbon nanotube field effect transistors and their elimination via methylsiloxane encapsulants and optimized growth procedures. Adv. Funct. Mater. 22, 2276-2284.
Jung SW, et al. (2010) Low-voltage-operated top-gate polymer thin-film transistors with high capacitance poly (vinylidene fluoride-trifluoroethylene)/poly(methyl methacrylate) dielectrics. J. Appl. Phys. 108, 102810.
Kim B, et al. (2013) Low voltage, high performance inkjet printed carbon nanotube transistors with solution processed ZrO2 gate insulator. Appl. Phys. Lett. 103, 082119.

Lau PH, et al. (2013) Fully printed, high performance carbon nanotube thin-film transistors on flexible substrates. Nano Letters. 13, 3864-3869.
Lau PH. (2013) Fully Printed, Flexible, High Performance Carbon Nanotube Top-gated Thin-film Transistors. Electrical Engineering and Computer Sciences University of California at Berkeley. Technical Report No. UCB/EECS-2013-63.
Lee CW, et al., High-Performance Inkjet Printed Carbon Nanotube Thin Film Transistors with High-k HfO2 Dielectric on Plastic Substrate, 2012, Small. vol. 8, 2941-2947.
Lin DW, et al. (2010) Versatility of Poly-L-Lysine for Carbon Nanotube Network Film Coating. 2010 MRS Spring Meeting, Symposium R, R5.16 Abstract.
Machado WS, Hummelgen IA. (2012) Low-voltage poly(3-hexylthiophene)/poly(vinyl alcohol) field effect transistor and inverter. IEEE Trans. Elec. Devices. 59, 1529-1533.
Miyata Y, et al. (2011) Length-sorted semiconducting carbon nanotubes for high-mobility thin film transistors. Nano Res. 4, 963-970.
Okimoto H, et al. (2010) Tunable carbon nanotube thin-film transistors produced exclusively via inkjet printing. Adv. Mater. 22, 3981-3986.
Park S, et al. (2013) A review of fabrication and applications of carbon nanotube film-based flexible electronics. Nanoscale. 5, 1727-1752.
Roberts ME, et al. (2009) Self-sorted nanotube networks on polymer dielectrics for thin-film transistors. Nano Letters. 9, 2526-2531.
Seo MS, Lee HL. (2005) Dielectric properties of cyanoethylated polyvinyl alcohol. TAPPI Journal. 4(5), 23-26.
Snow ES, et al. (2003) Random networks of carbon nanotubes as an electronic material. Appl. Phys. Lett. 82, 2145-2147.
Snow ES, et al. (2005) High mobility carbon nanotube thin film transistors on a polymeric substrate. Appl. Phys. Lett. 86, 033105.
Sun D-M, et al. (2011) Flexible high performance carbon nanotube integrated circuits. Nature Nanotechnology. 6, 156-161.
Sun D-M, et al. (2013) Mouldable all-carbon integrated circuits. Nature Communications.
Takahashi T, et al. (2011) Carbon nanotube active-matrix backplanes for conformal electronics and sensors. Nano Lett. 11, 5408-5413.
Tseng SH, Tai NH. (2009) Fabrication of a transparent and flexible thin film transistor based on single wall carbon nanotubes using the direct transfer method. Appl. Phys. Lett. 95, 204104.
Wang C, et al. (2012) Extremely bendable, high performance integrated circuits using semiconducting carbon nanotube networks for digital, analog and radio-frequency applications. Nano Lett. 12, 1527-1533.
Wang C, Takei T, Takahashi T, Javey A. (2013) Carbon nanotube electronics-moving forward. Chem. Soc. Rev. 42, 2592-2609.
Xu W, Rhee S-W. (2009) Low-operating voltage organic field effect transistors with high-k cross-linked cyanoethylated pullulan polymer gate dielectrics. J. Mater. Chem. 19, 5250-5257.
Xu W, Rhee S-W. (2010) Organic field-effect transistors with cross-lined high-k cyanothylated pulluan polymer as a gate insulator. Organic Electronics. 11(6), 996-1004.
Xu W, Guo C, Rhee S-W. (2012) Knitting up the inter-dipole gaps in dielectric surfaces; an efficient route for high performance organic field effect transistors. J. Mater. Chem. 22 6597-6602.
Xu W, Guo C, Rhee S-W. (2013) High performance organic field-effect transistors using cyanoethyl pullulan (CEP) high-k polymer cross-linked with trimethylolpropane triglycidyl ether (TTE) at low temperatures. J. Mater. Chem. C. 1, 3955-3960.
Yoon M-H, et al. (2005) Low voltage organic field effect transistors and inverters enabled by ultrathin cross-linked polymers as gate dielectrics. J. Am. Chem. Soc. 127, 10388-10395.
European Search Report for corresponding European Patent Application No. 15153179.

* cited by examiner

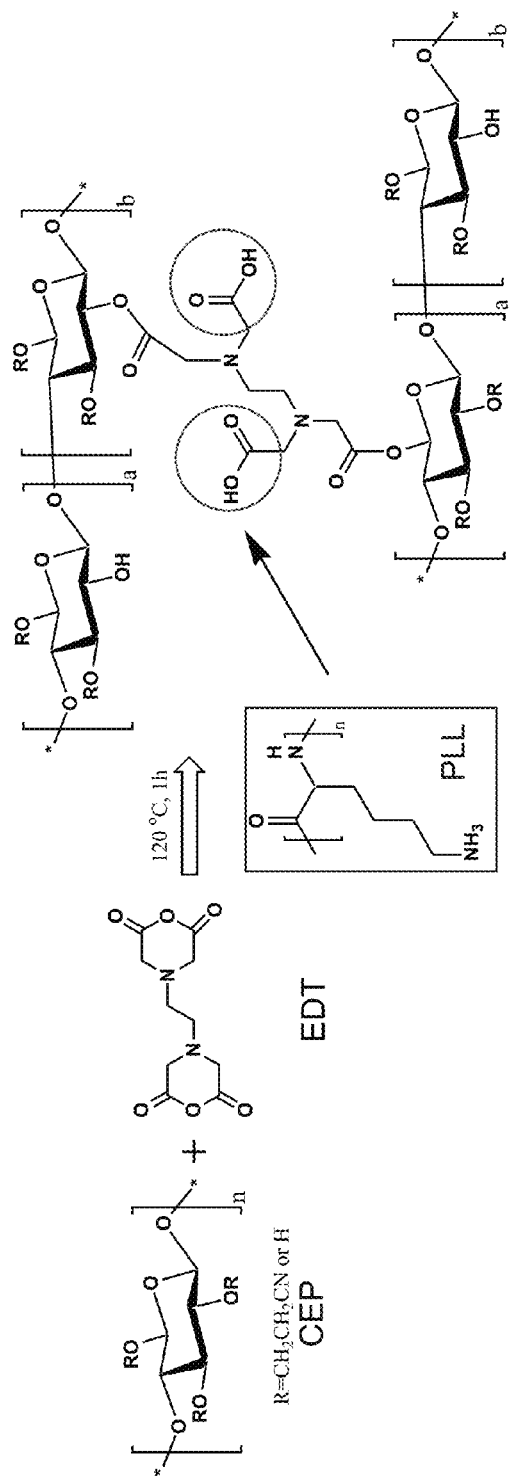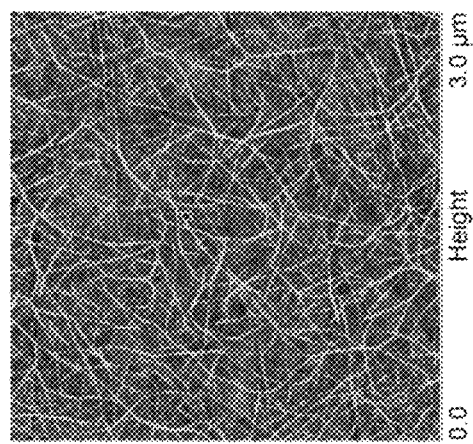
Fig. 1A
Fig. 1B

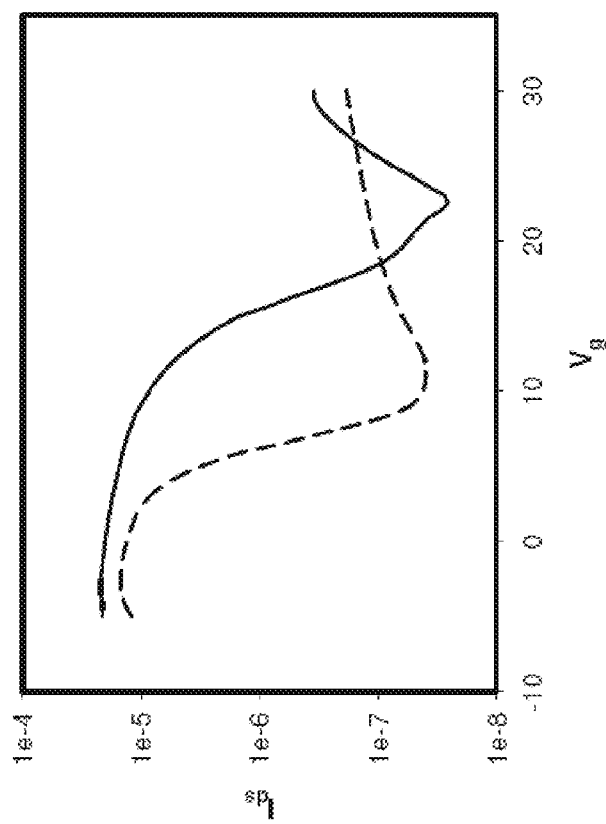
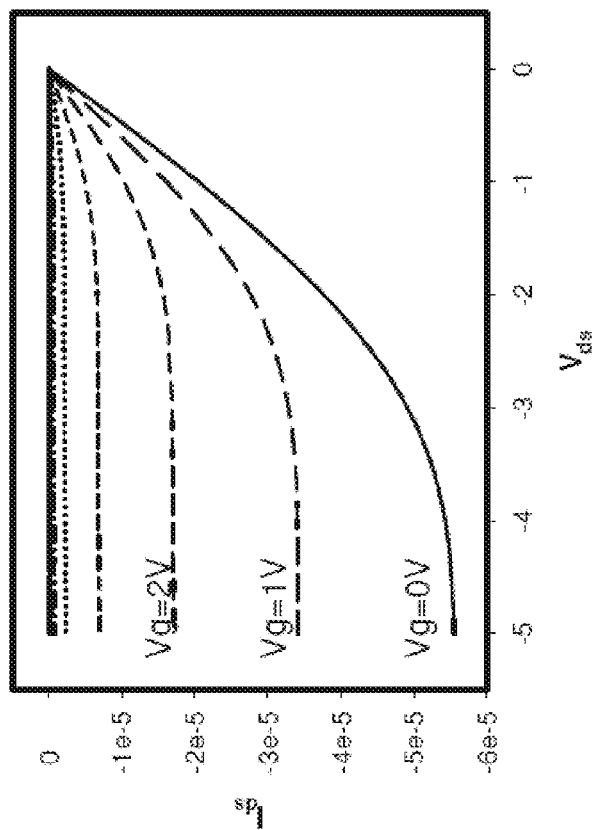
Fig. 2A
Fig. 2B

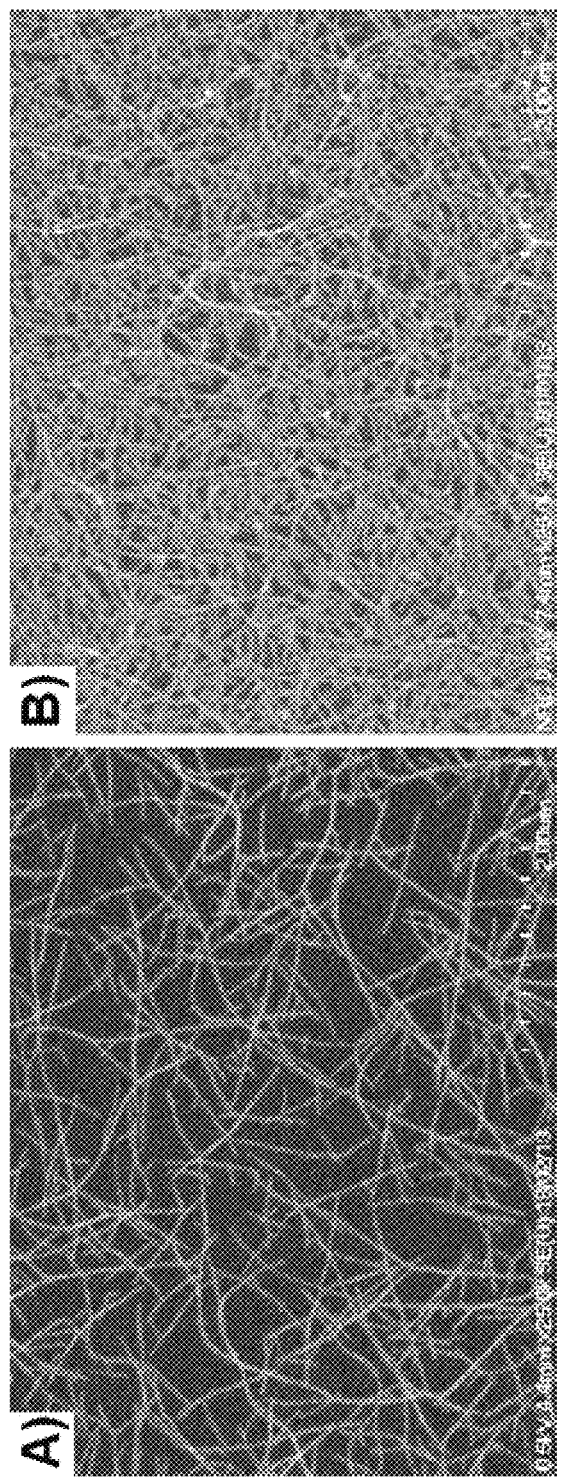

CNT THIN FILM TRANSISTOR WITH HIGH K POLYMERIC DIELECTRIC

This application claims the benefit of European Patent Application No. 14153150 filed Jan. 30, 2014, the entire contents of which is herein incorporated by reference.

FIELD

This application relates to electronics devices, particularly thin film transistors, and to methods of fabrication thereof.

BACKGROUND

Networks of single wall carbon nanotubes (SWCNTs) have shown considerable promise as the active channel material for high performance TFTs fabricated via solution processes. Compared with other competing solution processable semiconducting materials such as conjugated polymers or metal oxides SWCNTs offer significant advantages in terms of higher current densities and mobilities (Cao 2009; Wang 2013; Park 2013). Many SWCNT-based TFTs fabricated to date have utilized thermally grown or vapor deposited inorganic dielectrics such as $SiO_2$, $Al_2O_3$ or $HfO_2$ (Snow 2003; Snow 2005; Cao 2008; Okimoto 2010; Takahashi 2011; Sun 2011; Miyata 2011; Wang 2012; Lee 2012). Realization of all-printable devices on plastic substrates requires selection of solution processable gate dielectric materials with good mechanical properties and low curing temperatures. High capacitances ($>10$ $nF/cm^2$) are required in order to enable low voltage operation. Materials with high dielectric constants (k) are attractive in this regard since target capacitances can be attained with less stringent constraints on film thickness. This is particularly important for all printed devices due to the difficulties of printing thin pinhole free dielectric films. Solid polymer electrolytes (ion gels) offer extremely high capacitances per unit area but slow polarization response will limit their operation at higher frequencies (Ha 2010; Ha 2013). Recently Hersam and co-workers have demonstrated SWCNT TFTs with a high k $ZrO_2$ dielectric deposited by a sol-gel process (Kim 2013), however thermal curing of this material requires 500° C., incompatible with most plastic substrates.

Polymers are attractive candidates for gate dielectric materials in printed devices due to their solution processability, tunable surface chemistry, high degree of bendability, and ability to planarize rough surfaces. Several groups have reported the use of polymer dielectrics to demonstrate low voltage operation of organic field effect transistors (Yoon 2005; Xu 2009; Machado 2012; Xu 2012), but there have been fewer efforts to integrate these materials into SWCNT based TFTs. Bao and co-workers have employed thin (25 nm thick) poly(4-vinylphenol) (PVP) films deposited by spin coating as the gate insulator and demonstrated low voltage operation ($<1$ V) with mobilities as high as 13.4 $cm^2/Vs$, on/off ratios of $10^3$ and low sub-threshold slopes (130 mV/decade) (Roberts 2009). Polymethyl methacrylate (PMMA) has also been used as gate dielectric for SWCNT TFTs (Tseng 2009; Sun 2013). In order to raise the dielectric constant, $BaTiO_3$ nanoparticles have been incorporated into PMMA and formulated into a commercially available ink suitable for printing. Lau et al. have demonstrated gravure printing of this hybrid ink to fabricate gate dielectric films (k=17) on-top of SWCNT networks to form all-printed top gate TFTs with mobilities of about 4 $cm^2/Vs$ (Lau 2013).

Cyanoethylated pullulan is a polymer made by transforming some of the alcohol groups of this polysaccharide into cyanoethyl ether functions. The polar nature of the cyanoethyl groups give the material a high dielectric constant ($k\sim13$), significantly higher than PMMA or PVP. Previously Xu and Rhee have demonstrated its utility as a gate dielectric layer in pentacene TFTs (Xu 2009). Cyanoethylated pullulans, i.e. cyanoethyl dihidroxypropyl pullulan (CEDHPP), have also been disclosed as gate dielectrics in TFTs with organic semiconductors (Moon 2009; Fukui 2007).

Thin film transistors (TFTs) made from solution processes typically have low mobility values and require high voltages for operation. According to the prior art, small molecules, conjugated polymers and SWCNTs may be used to make solution processed TFTs. The use of single-walled carbon nanotubes (SWCNT) as the semiconducting channel material provides improvements, but better dielectric materials are required to lower operating voltages, increase on-state current densities and facilitate enhancement mode operation (ie. transistor off at zero volts). High k dielectrics such as $ZrO_2$ and $HfO_2$ provide improvements over $SiO_2$, but are not readily processable in solution at low temperatures. The use of cyanoethylated pullulans as a gate dielectric in a TFT have been disclosed in patent and publication literature although not demonstrated with SWCNTs as the semiconducting channel. Experiments have shown that applying aqueous dispersions of SWCNT directly on a cyanoethylated pullulan does not work because the SWCNT network does not adhere to the dielectric.

A low temperature solution processable, high quality dielectric capable of adsorbing SWCNT, yielding low voltage operation, high on-state currents and negative threshold voltages (enhancement mode operation) is desired in the art.

There remains a need for solution processable (at temperatures below 200° C.) carbon nanotube-based TFTs having high k gate dielectrics.

SUMMARY

There is provided a thin film transistor comprising: a gate electrode; a gate insulation layer comprising a cyanoethylated polyhydroxy polymer cross-linked by a cross-linker and adhered to the gate electrode; a polymeric material that reacts or interacts with the gate insulation layer; a semiconducting channel comprising a network of semiconducting carbon nanotubes adhered to the polymeric material and separated from the gate electrode by the gate insulation layer; a source electrode; and, a drain electrode.

There is further provided a method of adhering a semiconducting channel to a gate insulation layer for a thin film transistor, the method comprising adhering a gate insulation layer comprising a cross-linked cyanoethylated polyhydroxy polymer to a semiconducting channel comprising a network of semiconducting carbon nanotubes through a polymeric material that reacts or interacts with the gate insulation layer, the semiconducting channel adhered to the polymeric material.

There is further provided a method of producing a thin film transistor, the method comprising assembling a gate electrode, a gate insulation layer, a semiconducting channel, a source electrode and a drain electrode into a thin film transistor, wherein the semiconductor channel is adhered to the gate insulation layer through a polymeric material, the polymeric material reacting or interacting with the gate insulation layer, the gate insulation layer comprising a cyanoethylated polyhydroxy polymer cross-linked by a cross-linker, and the semiconductor channel comprising a network of semiconducting carbon nanotubes adhered to the polymeric material and separated from the gate electrode by the gate insulation layer.

It has been found that utilizing a gate insulation layer (i.e. a gate dielectric) comprising a cyanoethylated polyhydroxy polymer-based material having a high dielectric constant (k) to separate a carbon nanotube-based semiconducting channel from a gate electrode provides thin film transistors (TFTs) with several useful characteristics including electrical performance (high on-state currents and on/off ratios) similar to that observed using much thinner $SiO_2$ gate dielectrics, low operating voltages (<5V), enhancement mode operation and low hysteresis (<1 V). These improvements may arise from fewer trap sites in the channel network of the carbon nanotubes in TFTs of the present invention, which are a result of unique surface chemistry rather than an inherent dielectric property of the cross-linked cyanoethylated polyhydroxy polymer.

It has also been found that difficulties in adherence of the semiconducting carbon nanotubes directly to the cross-linked cyanoethylated polyhydroxy polymer-based material may be mitigated by mediation of a polymeric material that reacts or interacts with the gate insulation layer by a cross-linker, the semiconducting carbon nanotubes adhering to the polymeric material.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which:

FIG. 1A depicts a scheme showing that cross-linking of a cyanoethylated pullulan (CEP) with ethylenediaminetetracetic dianhydride (EDT) leads to formation of dangling carboxylic acid groups which facilitate the electrostatic binding of poly-L-lysine (PLL) promoting the adhesion of semiconducting SWNTs.

FIG. 1B depicts an atomic force microscopy (AFM) image of a dense SWCNT network formed by incubating PLL treated CEP films in 0.01 mg/mL NI-99% S-SWCNT solution for 15 minutes.

FIG. 2A depicts current-voltage (gate voltage incremented in 1 V steps) and FIG. 2B depicts transfer characteristics ($V_{ds}$=-0.5 V) for a SWCNT TFT on CEP/PVP dielectric gate stack with a thickness of 370 nm. The SWCNT network was formed by soaking in NI-99% S-SWCNT solution for 15 minutes followed by rinsing with IPA and water. Ti/Pd top contacts were evaporated through a shadow mask (L=50 μm, W=100 μm).

FIGS. 3A and 3B depicts scanning electron microscope (SEM) images of SWCNT networks formed on a CEP/PVP dielectric stack on silicon, where SWCNT networks were formed by treating the CEP with PLL (5 min) followed by soaking for 3 minutes (FIG. 3A) and 15 minutes (FIG. 3B) in NI-99% S-SWCNT solutions (0.01 mg/ml). The nanotube densities in the two images are determined to be about 10 $μm^{-2}$ in FIG. 3A and >100 $μm^{-2}$ in FIG. 3B.

DETAILED DESCRIPTION

Figure 4:
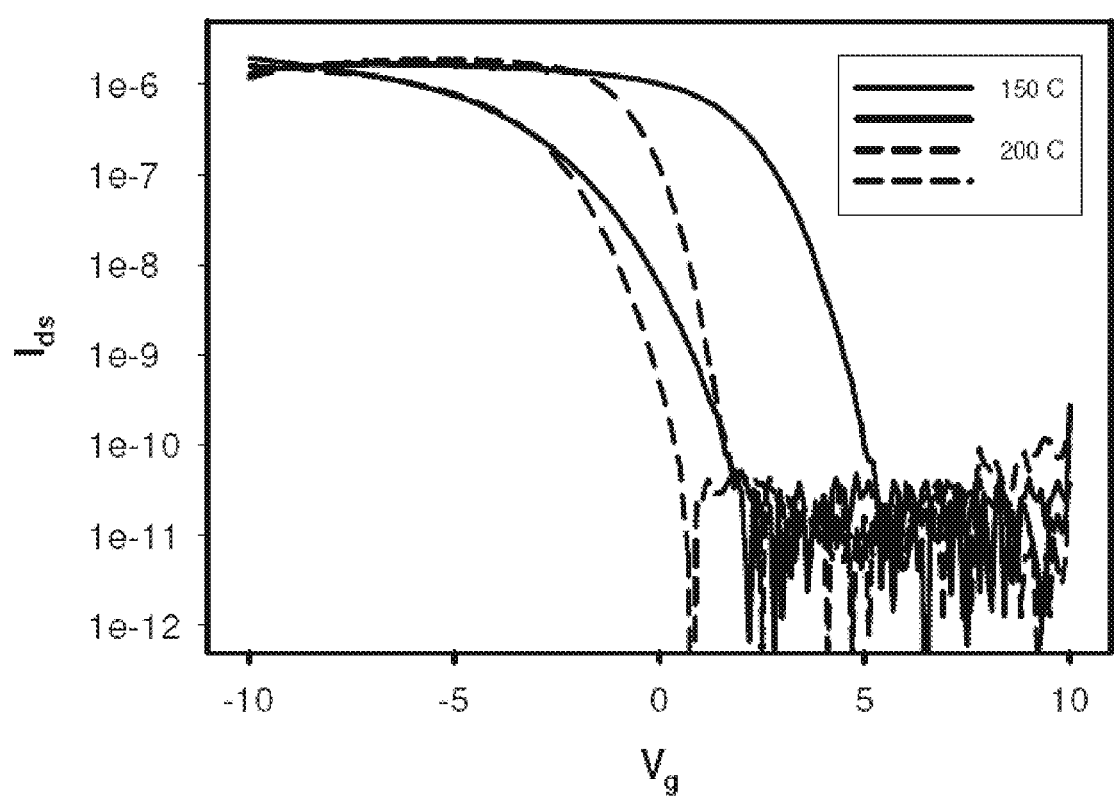
FIG. 4 depicts transfer characteristics ($V_{ds}$=-2 V) of SWCNT network TFTs on CEP (1200 nm)/PVP (20 nm) dielectric stack on a silicon substrate. The CEP was treated with PLL followed by soaking in NI-99% S-SWCNT solution for 3 minutes. Samples were then annealed at the indicated temperatures prior to evaporation of Ti/Pd source drain electrodes (L=25 μm, W=100 μm).

The gate insulation layer, also called a gate dielectric, separates the gate electrode of a thin film transistor (TFT) device from the semiconducting channel, thereby insulating the gate electrode from the semiconducting channel. The gate insulation layer may also insulate the gate electrode from the source electrode and the drain electrode. The gate insulation layer comprises a cross-linked cyanoethylated polyhydroxy polymer having a high dielectric constant (k), for example a k of about 10 or greater, or about 12 or greater, or about 13 or greater. The cross-linked cyanoethylated polyhydroxy polymer comprises a cyanoethylated polyhydroxy polymer cross-linked by a cross-linker. The cyanoethylated polyhydroxy polymer preferably comprises a cyanoethylated pullulan (CEP), a cyanoethylated polyvinyl alcohol, a cyanoethylated polyvinylphenol, a cyanoethylated cellulose or any mixture thereof. The cyanoethylated polyhydroxy polymer more preferably comprises a cyanoethylated pullulan (CEP). Pullulan is a polysaccharide polymer comprising maltotriose units. Three glucose units in maltotriose are connected by an α-1,4 glycosidic bond, whereas consecutive maltotriose units are connected to each other by an α-1,6 glycosidic bond. A cyanoethylated pullulan is a pulluan derivative in which one or more —OH functionalities in the pullulan have been converted to a group comprising a $CH_2CH_2CN$ moiety. Particularly preferred cyanoethylated pullulans include cyanoethyl pullulan and cyanoethyl dihydroxypropyl pullulan (CEDHPP).

The gate insulation layer may be brought together with the gate electrode, and if greater adherence is desired an adherence layer may be disposed between the layer of cross-linked cyanoethylated polyhydroxy polymer and the gate electrode. The adherence layer may comprise, for example, polyvinylphenol (PVP), polyvinyl alcohol (PVA), polyethylene glycol (PEG) or any mixture thereof, and is generally thin (e.g. 1-20 nm). In another embodiment, the gate insulation layer may comprise a blend of the cross-linked cyanoethylated polyhydroxy polymer and an adherence aid, for example polyvinylphenol (PVP), polyvinyl alcohol (PVA), polyethylene glycol (PEG) or any mixture thereof. When the gate insulation layer comprises such a blend, the adherence aid may help adherence of the gate insulation layer to both the gate electrode and the semiconducting channel. The gate insulation layer preferably has a thickness in a range of about 100-750 nm, including any adherence layer.

The semiconducting channel comprises a network of semiconducting carbon nanotubes (sc-CNTs). The CNTs may be single-walled or any other suitably semiconductive CNT. Single-walled carbon nanotubes (SWCNTs) are preferred. Production of semiconducting CNTs generally results in a sample comprising a mixture of both semiconducting (sc) and metallic (m) carbon nanotubes, as well as side products such as metals and/or non-CNT carbon (e.g. graphene, carbon black, amorphous carbon). Such mixtures may be used provided there is a sufficient amount of semiconducting CNTs in the mixture, for example 70 wt % or more, based on total weight of carbon nanotubes in the sample, and if the network is diluted. Preferably, the CNTs have been purified to reduce or eliminate metallic carbon nanotubes (m-CNTs). Preferably, the sc-CNTs have a purity of about 80 wt % or more, or about 90 wt % or more, or about 95 wt % or more, more preferably about 97 wt % or more, even more preferably about 98 wt % or more, yet even more preferably about 99 wt % or more. Purity is based on total weight of carbon nanotubes. For example, a purity of about 99 wt % or more as expressed herein means that for every 100 g of carbon nanotubes in a sample, 99 g or more are sc-CNTs and less than 1 g are m-CNTs.

The CNTs may be pristine or unmodified or may be modified with a polymer, which polymer as discussed below could be the polymeric material that reacts or interacts with the gate insulation layer. The polymer used to modify the CNTs may be a conjugated polymer, for example the conjugated polymer-wrapped sc-SWCNTs as described in copending U.S. application 61/867,630 filed Aug. 20, 2013 or in Gerstel et al. and Ding et al. (Gerstel 2014; Ding 2014), the entire contents of which are herein incorporated by reference. Some examples of conjugated polymers include polyfluorenes, polythiophenes, polyphenylenevinylenes, and their copolymers with one or more co-monomer units. Co-monomer units may include, for example, anthracyl, azobenzyl, azomethinyl, benzothiadiazolyl, biphenyl, biphenylenyl, bipyridinyl, bithiophenyl, ethynyl, naphthyl, phenylenyl, stilbenyl, triazolyl (e.g. 1,2,3-triazolyl) units or combinations thereof. Polyfluorenes may be preferred and include, for example, 9,9-dialkyl-substituted polyfluorenes. 9,9-dialkyl-substituted polyfluorenes may include, for example, 9,9-diC$_{10-36}$-alkyl-substituted polyfluorenes, 9,9-diC$_{10-18}$-alkyl-substituted polyfluorenes, 9,9-diC$_{8-36}$-alkyl-substituted polyfluorenes or 9,9-diC$_{8-18}$-alkyl-substituted polyfluorenes (e.g. 9,9-dioctylfluorenes). The semiconducting channel preferably has a thickness in a range of about 1-100 nm.

Aqueous dispersions of CNTs typically used in the art comprise surfactants that are removed in a rinsing step. Further, even if such a rinsing step was not necessary, other rinsing or processing steps during TFT fabrication would destroy the network of CNTs on the gate insulation layer because semiconducting carbon nanotubes do not necessarily adhere well to cyanoethylated polyhydroxy polymer. The cyanoethylated polyhydroxy polymer is therefore cross-linked and the semiconducting carbon nanotubes are adhered to the gate insulation layer through a polymeric material. The polymeric material reacts or interacts with the gate insulation layer, for example by covalent bonding, ionic bonding, hydrophobic interaction, van der Waals forces, physisorption, chemisorption or other chemical or physical interaction. The semiconducting carbon nanotubes are adhered to the polymeric material. In one embodiment, the cyanoethylated polyhydroxy polymer is cross-linked by a cross-linker and the cross-linker is capable of reacting or interacting with the gate insulation layer to permit reaction or interaction of the polymeric material with the gate insulation layer.

Any suitable polymeric material that can adhere CNTs and react or interact with the gate insulation layer may be employed, for example polyamino acids (e.g. poly-L-lysine (PLL), poly-L-ornithine, poly-L-histidine, poly-L-arginine), polymers with pendant amine groups, polymers with pendant amino silane groups, polyvinylphenol, the conjugated polymers described above or any blend thereof.

In one embodiment, the polymeric material may be formed as a layer on the gate insulation layer with the inclusion of a cross-linker to cross-link the cyanoethylated polyhydroxy polymer and to permit reaction or interaction of the polymeric material with the cyanoethylated polyhydroxy polymer. The polymeric material used has the ability to adhere CNTs, for example by surface adsorption, chemical reaction or absorption, and the CNTs are then deposited on the polymeric layer whereupon they become adhered to the polymeric layer. In another embodiment, the CNTs may be pre-adhered to the polymeric material, for example the modified CNTs described above, and the CNTs together with the polymeric material and a cross-linker brought into contact with the cyanoethylated polyhydroxy polymer. The cross-linker cross-links the cyanoethylated polyhydroxy polymer and the cross-linked cyanoethylated polyhydroxy polymer reacts or interacts with the polymeric material. A separate layer of polymeric material between the gate insulation layer and the semiconducting channel is not formed. In yet another embodiment, CNTs pre-adhered to a first polymeric material may be brought into contact with a layer of a second polymeric material on the gate insulation layer. Adherence of the second polymeric material to the cyanoethylated polyhydroxy polymer may be assisted by the cross-linker, adherence of the first polymeric material to the second polymeric material may be assisted by the cross-linker or both.

The cross-linker is of special importance. The cross-linker should be capable of cross-linking the cyanoethylated polyhydroxy polymer to permit reaction or interaction of the polymeric material with the gate insulation layer. The cross-linker preferably modifies the surface of the gate insulation layer by modifying the cyanoethylated polyhydroxy polymer to be more receptive to the polymeric material. In one embodiment, reaction of the cross-linker with the cyanoethylated polyhydroxy polymer results in residual carboxylic acid groups at the surface of the gate insulation layer facilitating adsorption of a polymeric material comprising acid reactive groups (e.g. amine groups), which in turn promotes adhesion of the CNTs. The cross-linker preferably comprises a dianhydride or a dianhydride derivative. The dianhydride is preferably an acetic dianhydride. Some examples of cross-linkers include ethylenediaminetetraacetic dianhydride (EDT), benzophenone-3,3',4,4'-tetracarboxylic dianhydride (BPT), diethylenetriaminepentaaceticdianhydride (DAPD), biphenyl-4,4'-dicarboxylic acid (BCA), suberoyl chloride or any mixture thereof.

The gate electrode may comprise a metallic or non-metallic electrical conductor. For example, a metallic gate electrode may comprise aluminum (Al), copper (Cu), molybdenum (Mo), titanium (Ti), nickel (Ni), tungsten (W), silver (Ag), gold (Au), palladium (Pd), platinum (Pt), chromium (Cr), neodymium (Nd), zinc (Zn), cobalt (Co), any mixtures thereof or any alloys thereof. A metallic gate electrode may comprise metallic nanowires. A non-metallic gate electrode may comprise, for example, doped silicon, indium tin oxide (ITO), indium zinc oxide (IZO), aluminum-doped zinc oxide (AZO), a nanocarbon (e.g. graphene or carbon nanotubes), conducting polymers or any mixture thereof. Embodiments of the present invention are not limited to any of the above-mentioned materials for the gate electrode. The gate electrode preferably has a thickness in a range of about 1-1000 nm.

The source and drain electrodes provide electrical contacts for the TFT. The source electrode and the drain electrode may be formed by, for example, printing a conductive material on another layer in the TFT. The conductive material may include, for example, nanoparticles. The conductive material may comprise a metallic or non-metallic electrical conductor. Metallic conductors may comprise, for example, aluminum (Al), copper (Cu), molybdenum (Mo), titanium (Ti), nickel (Ni), tungsten (W), silver (Ag), gold (Au), palladium (Pd), platinum (Pt), chromium (Cr), neodymium (Nd), zinc (Zn), cobalt (Co), any mixtures thereof or any alloys thereof. Metallic conductors may comprise metallic nanowires. Non-metallic conductors may comprise, for example, doped silicon, indium tin oxide (ITO), indium zinc oxide (IZO), aluminum-doped zinc oxide (AZO), a nanocarbon (e.g. graphene or carbon nanotubes), conducting polymers or any mixture thereof. Embodiments of the present invention are not limited to any of the above-mentioned materials for the source and drain electrodes. The source and drain electrodes preferably have thicknesses in a range of about 1-1000 nm.

The TFT may further comprise interface modifiers between layers of the TFT and/or between any of the electrodes and various layers of the TFT. Interface modifiers, when present, preferably have a range of about 1-40 nm.

The elements of the TFT may be supported on a substrate to provide rigidity and strength to the device. Substrates may comprise any suitably robust and non-reactive material. Substrates include, for example, glass, silicon, silicon dioxide, quartz, metal foil and various plastics. Plastics include, for example, polyethylene terephthalate (PET), poly(4,4'-oxydiphenylene-pyromellitimide) (e.g. Kapton™) and polyethylene naphthalate (PEN). Substrates preferably have thicknesses in a range of about 50-10,000 μm.

The various layers, channels and electrodes may be brought together by any suitable method, for example spin coating, vapor deposition, printing (e.g. screen printing, ink jet printing, gravure printing, flexo printing, aerosol printing) and the like. The order in which the various elements are constructed depends on TFT design, the materials involved and the processes used to assemble the elements.

TFT devices in accordance with the present invention may exhibit apparent mobilities of about 10 $cm^2/Vs$ or greater, even about 30 $cm^2/Vs$ or greater, even about 50 $cm^2/Vs$ or greater.

TFT devices in accordance with the present invention may have on/off ratios ($I_{on}/I_{off}$) of about $10^3$ or greater, or $10^4$ or greater, or even $10^5$ or greater.

TFT devices in accordance with the present invention may have low operating voltages as low as about 5 V or less, or even about 3 V or less. TFTs may have low sub-threshold slopes as low as about 500 mV/decade or less, or about 300 mV/decade or less, or even about 150 mV/decade or less. TFTs may have low hysteresis as low as about 2 V or less or even about 1 V or less. Annealing the TFT may improve hysteresis. Annealing may be accomplished at a temperature in a range of 125-225° C., preferably 140-200° C., for example 140° C. or 200° C., especially 200° C.

TFT devices of the present invention provide an excellent balance of high on-state currents, low operating voltage, low hysteresis, high on/off ratios and enhancement mode operation. In one embodiment, the TFT device operates at voltages of about 5 V or less exhibiting apparent mobilities of >10 $cm^2/Vs$ with on/off ratios of about $10^4$ or greater and a hysteresis of about 1 V or less. Cyanoethylated polyhydroxy polymers, especially cyanoethylated pullulans, are excellent solution processable gate dielectrics for the fabrication of semiconducting CNT network TFTs, especially sc-SWCNT network TFTs. Current densities are similar to those achieved at similar tube densities on considerably thinner silicon oxide ($SiO_2$) dielectrics, indicating that cyanoethylated polyhydroxy polymers are excellent gate dielectric materials for TFTs fabricated by printing or other solution-based processes. Importantly, these devices exhibit enhancement mode operation (negative threshold voltage for a p-channel TFT).

Example 1

Fabrication of CEP-SWCNT Thin Film Transistors (TFTs) with Poly-L-Lysine (PLL) Polymeric Layer Films of Cyanoethylated Pullulan (CEP)

Cross-linkable solutions suitable for spin casting were prepared in a co-solvent (dimethyl formamide:propylene glycol methyl ether acetate 2:1) by dissolving 0.5 g of cyanoethylated pullulan (CEP) having k of 13 (from Shin-etsu Chemical Co., Tokyo, Japan) along with 0.074 g of ethylenediaminetetracetic dianhydride (EDT). Dielectric films were prepared by spin coating (1 minute at 3000 rpm) these solutions onto a gate comprising a cleaned silicon substrate with a thin (1-2 nm) native oxide layer. This produced films of about 180 nm thickness, with thicker films being prepared by repeating this step. Films were annealed to 80° C. for 5 minutes after each layer in order to reduce bubbles and pinholes. Cross-linking of the film was carried out by annealing at 120° C. for 1 hour. Film thickness was determined by both ellipsometry and profilometry. In order to overcome problems with delamination of the CEP films upon water rinsing (required by the process to form SWCNT networks from aqueous solution), a thin layer of polyvinylphenol (PVP) was employed as an adhesion layer. Spin coating of a solution (0.15 g of PVP in 10 mL NMP with 0.015 g of EDT as cross-linker) resulted in films of thickness 8-20 nm, which were cross-linked by heating at 140° C. for 1 hour. CEP films formed on top of this PVP layer were found to be quite robust, surviving extensive water rinsing.

To determine the capacitance of the CEP films, Au contacts of different areas were evaporated on the films to form metal-insulator-semiconductor (MIS) capacitors. Capacitances were measured at frequencies between 1-100 kHz and the capacitance per unit area was determined by plotting the measured capacitance as a function of area of the contact. The linearity of the capacitance versus area plots indicate that the films are reasonably homogenous as large thickness variations across the sample would lead to deviations from linearity. For a 180 nm CEP film, the slope of the linear fit is 75 nF/cm$^2$ whereas for a thicker dielectric stack (540 nm of CEP on a 16 nm PVP adhesion layer) the slope is 21 nF/cm$^2$. These values are consistent with the estimated film thicknesses and the dielectric constant of the CEP being about 13.

TFT Assembly

To fabricate TFTs, nanotube networks were formed on the CEP dielectric stacks from commercially available aqueous surfactant solutions of 99% semiconductor enriched SWCNTs (NanoIntegris Inc) referred to as NI-99% S. The tube concentration in these solutions is 0.01 mg/mL and film formation generally requires extensive rinsing to remove the 1% w/v of proprietary ionic surfactant mixture. To ensure the tubes remain adhered to the CEP during rinsing the CEP film was first modified by incubation for 5 minutes in a poly-L-lysine (PLL) solution (0.1% w/v in water; Sigma Aldrich) followed by a deionized (DI) water rinse. This procedure results in the formation of an amine terminated adhesion layer. After formation of the PLL layer the sample is subsequently immersed into the SWCNT solution for 3-15 minutes followed by rinsing with DI water and isopropanol, then blow drying in nitrogen. In the absence of PLL modification of the CEP films, most of the tubes are removed during rinsing resulting in very low tube densities well below the percolation threshold.

Control experiments with CEP films have also indicated that PLL does not stick to the surface of the film in the absence of a suitable cross-linker (Table 1). In the control experiments, CEP (uncross-linked, cross-linked with poly (methylated melamine-co-formaldehyde) (PMMF) or cross-linked with EDT) was spin coated on a polyethylene terephthalate (PET) substrate resulting in a film thickness of about 500-1000 nm. The film was soaked in an aqueous solution with or without PLL for 5 minutes and dried. Then the film was soaked in an aqueous solution of NI-99% S SWCNT for 5 minutes and dried. Conductivity was then measured.

TABLE 1

|  | Without PLL | With PLL 5 min |
|---|---|---|
| CEP | No current | No current |
| CEP + PMMF | No current | No current |
| CEP + EDT | No current | Conductive |

The lack of conductivity in some of the samples indicates that PLL does not stick to the surface of the film in the absence of a suitable cross-linker. This suggests that carboxylic acid functionalities formed during the cross-linking reaction may contribute to binding positively charged PLL as indicated by the scheme in FIG. 1.

TFT fabrication was completed by the evaporation of Ti (5 nm)/Pd (100 nm) source-drain contacts directly on top of the network through a shadow mask. The resulting TFT array has devices all with channel widths of 100 μm but different channel lengths (25, 50, 75 and 100 μm). Twenty-five devices of each geometry were fabricated enabling statistical analysis of device performance. Contact to the silicon substrate, which functions as a bottom gate is made by scratching the backside of the wafer, applying 2% HF for 1 minute followed by InGa eutectic and a molybdenum foil. Transistor characterization was carried out in an ambient probe station equipped with two Kiethley 2400 source-measure units.

Example 2

Characterization of TFTs from Example 1

FIG. 2A and FIG. 2B show output characteristics for a SWCNT TFT formed on a CEP/PVP gate dielectric stack prepared as described in Example 1. Good device characteristics are observed, with the current-voltage curves in FIG. 2A saturating at low (<5 V) source-drain voltages and substantial on-state currents (in saturation) of >50 μA, corresponding to a current density of about 0.5 μA/μm. The transfer characteristics at low source-drain voltage are plotted in FIG. 2B. Fitting the linear region of these curves and using a parallel plate model with an insulator capacitance of 31 nF/cm$^2$ (370 nm CEP layer with k=13) results in apparent mobilities of 40-75 cm$^2$/Vs, with the higher value extracted by sweeping the voltage from negative to positive gate voltages (i.e. turning the device off). While this mobility value is quite high compared to other results obtained with NI tubes, the on-off ratio is only on the order of 10$^2$. As seen in FIG. 2A and FIG. 2B, the device also exhibits significant hysteresis of about 10V. In order to probe the uniformity across the chip the on-state current (at $V_g$=0 and $V_{ds}$=-0.5V) of all 25 devices (all of them functioning as TFTs) was surveyed. The average current was 9.9±2.6 μA, indicating that the variability is about 25% (similar to that observed using silicon oxide as the dielectric). The highest current device showed an apparent mobility of 90 cm$^2$/Vs. The trade-off between mobility and on-off ratio in SWCNT network TFTs is well-established and is a consequence of the limited capability of most current sorting methods to reduce metallic tube content below 1% (Wang 2013; Park 2013). Higher tube densities in the network increase the current and effective mobility but with metallic tubes present in the sample this also increases the probability of a metallic percolating path. Bundling of tubes, more likely to occur at higher tube densities, can also reduce the effectiveness of the gate voltage due to tube-tube screening (Cao 2009; Kim 2013). Therefore in order to improve the on/off ratio without significantly decreasing the mobility, the SWCNT density in the channel may be optimized. FIG. 3A and FIG. 3B show SEM images of SWCNT networks formed on a PLL treated cross-linked CEP/PVP dielectric stack for different incubation times. Decreasing the soaking time in the SWCNT solution from 15 to 3 minutes is clearly shown to reduce the resulting density by a factor of 10. As seen in FIG. 3B, 15 minutes incubation in the 0.01 mg/ml solution leads to formation of a very dense network, consistent with the AFM image in FIG. 1 and the device results in output characteristics shown in FIG. 2A and FIG. 2B, which showed high mobility with low on/off ratio.

Based on the SEM images in FIG. 3A and FIG. 3B, and in an attempt to increase the on/off ratio, TFTs on CEP were prepared by soaking for 3 minutes in NI-99% SWCNT solutions. Also, in an attempt to reduce hysteresis, the effect of annealing at different temperatures was explored following the work of Xu and Rhee (Xu 2009). Two different chips were prepared using the same CEP/PVP dielectric stack and were annealed at 150° C. and 200° C. Transfer characteristics of these devices are summarized in FIG. 4. The reduced incubation time clearly leads to higher on/off ratios with the off state current typically limited by the noise floor of our electronics (about 50 pA). The on/off ratio of these devices is seen to be about $10^5$. The on-state current is also reduced compared to the data in FIG. 2A and FIG. 2B, but the dielectric stack is also thicker which is expected to reduce the current which is linearly dependent on the capacitance of the gate dielectric. For this dielectric stack the capacitance is calculated to be 9.2 nF/cm$^2$. Assuming this value of capacitance, the apparent mobilities extracted on these devices are about 10 cm$^2$/Vs. Annealing the chip after SWCNT deposition but prior to evaporating the source and drain contacts is seen to reduce the hysteresis substantially. The device annealed at 150° C. already shows less hysteresis than shown in FIG. 2A and FIG. 2B, and annealing to 200° C. further reduces it to <2 V. Since the amount of hysteresis is dependent on the sweep rate of the gate voltage, as previously reported for devices fabricated on SiO$_2$ (Jin 2012; Hur 2010), it is necessary to compare devices measured at the same sweep rate. The curves in FIG. 4 were obtained at a sweep rate of 1 V/s. Reducing the sweep rate (to 0.1 V/s) on the devices annealed at 200° C., further reduces the hysteresis to <1 V.

Figure 5B:
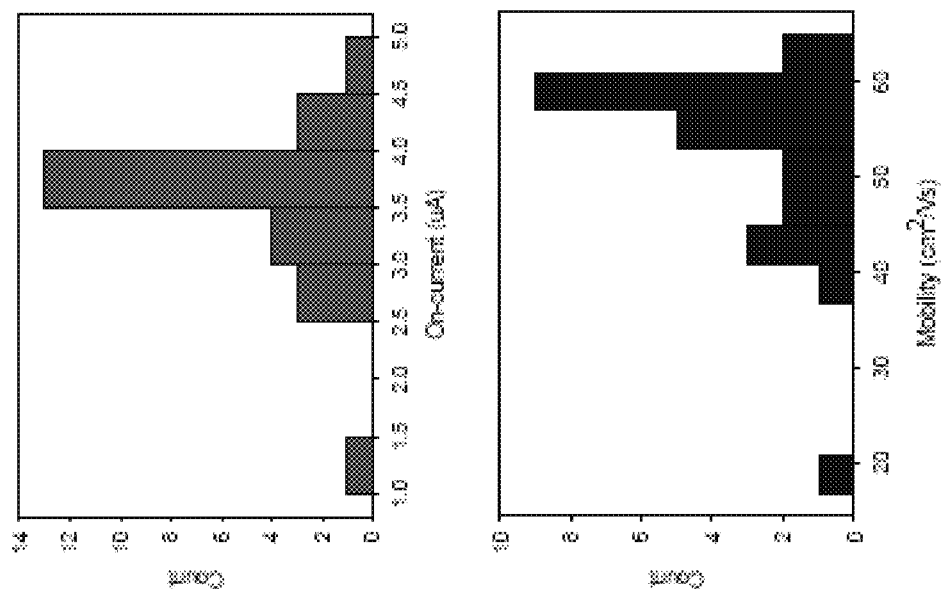
FIG. 5B depicts histograms of the on-state current (measured at $V_{ds}$=-1V and $V_g$=-2V) and apparent mobility calculated as described in the text.
Figure 5A:
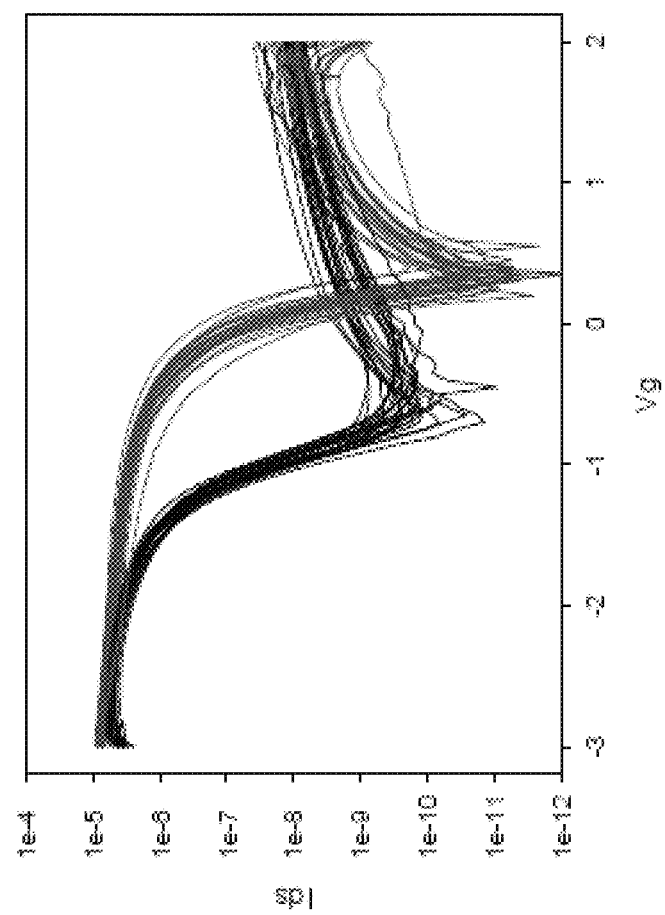
FIG. 5A depicts transfer curves ($V_{ds}$=-1 V) for 25 SWCNT TFTs (L=25 μm, W=100 μm) fabricated on a CEP (560 nm)/PVP (8 nm) dielectric stack.

Use of SWCNT TFTs as components for fabricating electronic devices requires characterization and reduction of device to device variability. In order to characterize the variability for TFTs on CEP 25 nominally identical devices made on one chip were measured and analyzed. The dielectric stack comprised 560 nm of CEP with an 8 nm thick PVP adhesion layer. Transfer curves for all 25 devices are shown in FIG. 5A.

On a logarithmic scale most of the devices are seen to be rather similar, turning on below 0 V, turning off near −1 V and with on currents of about $5\times10^{-6}$ A and off currents below $1\times10^{-9}$ A. These devices also exhibit low sub-threshold slopes of ~150 mV/decade. This is comparable to that observed by Roberts et al. using an ultrathin PVP gate dielectric (Roberts 2009). Another characteristic of these devices on CEP is the appearance of an n-channel at positive gate voltages. Although SWCNT transistors are intrinsically ambipolar, this behavior is typically observed only under vacuum (Ha 2010; Aguirre 2009). In ambient, water and oxygen tend to enhance the p-channel and suppress the n-channel, especially on SiO$_2$ substrates (Aguirre 2009). It appears that this effect is reduced on CEP allowing the n-channel to be observed (although the current is still two to three orders of magnitude lower than on the p-side). Plotting the current on the linear scale (for the sweep to positive gate voltages) allows mobilities and threshold voltages to be extracted. Averaging over all devices the mobility is 53±10 cm$^2$/Vs and the spread is shown in the histogram in FIG. 5B. The threshold voltage is determined to be −1.13±0.09 V. Analyzing the measured on-current at a gate voltage of −2 V yields an average value of 3.5±0.7, indicating that the variability in this parameter is also approximately 20%. Day-to-day variations on this order are also observed due to changes in ambient (humidity and temperature). Although other factors likely contribute to the variability, to truly evaluate uniformity, devices should be encapsulated in order to minimize these ambient effects (Jin 2012).

Similar SWCNT TFTs were fabricated on SiO$_2$ gate dielectrics and characterized for comparison purposes. The tube networks were formed by treating the clean SiO$_2$ in PLL followed by immersion in the same NanoIntegris 99% semiconducting SWCNT enriched aqueous solutions followed by evaporation of Ti/Pd top contacts. As for the CEP devices all twenty five 25 µm channel length devices were measured with the average mobility determined to be 17±3 cm$^2$/Vs and on/off ratios of about $7\times10^4$. Compared to the devices on SiO$_2$ the TFTs on CEP exhibit lower hysteresis and subthreshold slopes. Furthermore, in contrast to SiO$_2$ where the devices are on at zero volts, the current devices function as enhancement mode devices, a desirable attribute for fabrication of digital logic circuits.

Example 3

Fabrication of CEP-SWCNT Thin Film Transistors (TFTs) with Polymer Modified sc-SWCNTs On a Si substrate with native SiO$_2$ layer, a cross-linked CEP film with a thickness of about 500 nm was prepared as in Example 1. Polyfluorene-wrapped purified sc-SWCNTs in a toluene solution was prepared as described in copending U.S. application 61/867,630 filed Aug. 20, 2013. The polyfluorene is poly(9,9-diC$_{12}$alkylfluorene (PFDD). The concentration of the SWCNTs in the solution is 0.026 mg/mL and polyfluorene/SWCNT weight ratio is 5 to 1. The CEP film was then soaked in this SWCNT solution for 10 minutes before rinsing with toluene.

Figure 6:
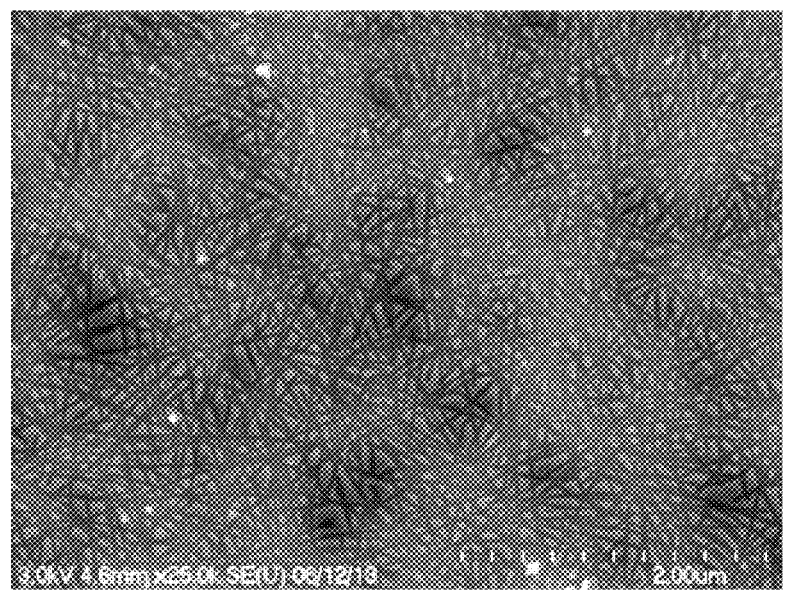
FIG. 6 depicts SEM image of SWCNT network formed on a CEP/PVP dielectric stack on silicon, where SWCNT networks were formed by soaking the substrate for 10 minutes in a polyfluorene/SWCNT toluene solution (PFDD is poly(9,9-di$C_{12}$alkylfluorene, concentration of SWCNT is 0.026 mg/mL, and weight ratio of polyfluorene/SWCNT is 5/1).

Based on the SEM images in FIG. 6, a uniform and high density SWCNT network was formed on the surface of cross-linked CEP layer. This result compared dramatically with that of aqueous SWCNT solutions, where a PLL coating layer has to be used to get good adhesion and a high density network.

Example 4

Characterization of TFTs from Example 3

Figure 7:
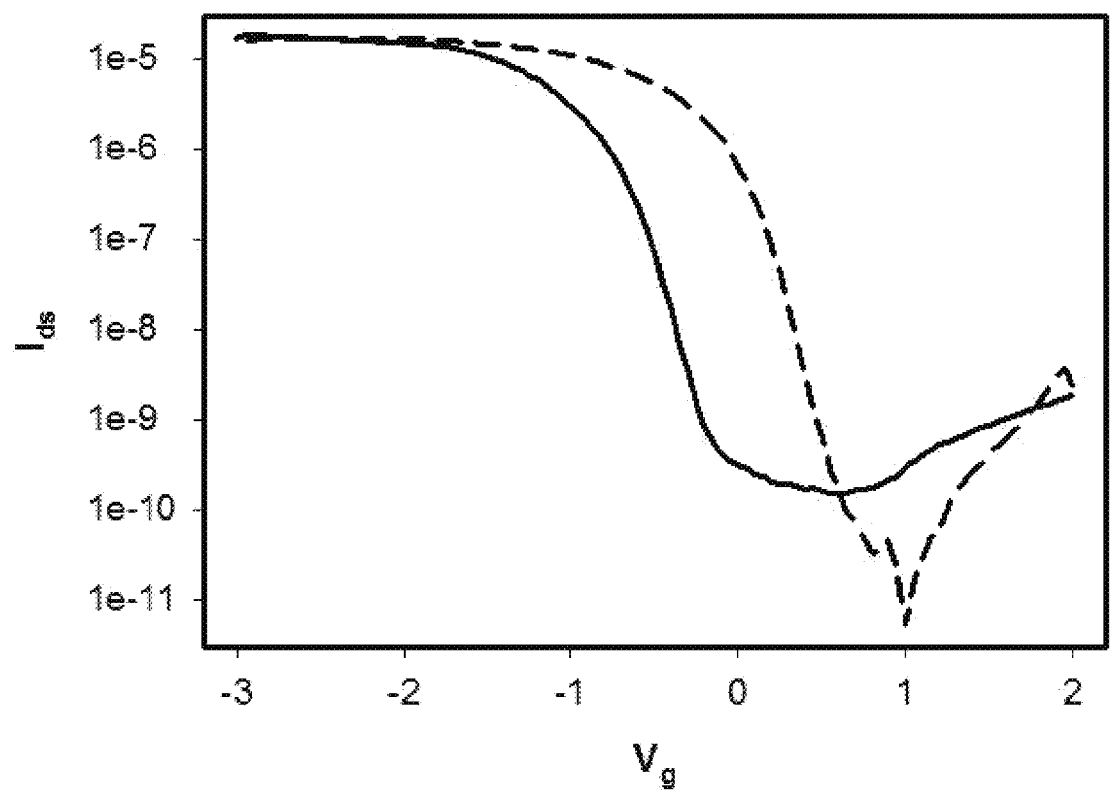
FIG. 7 depicts transfer curves ($V_{ds}$=-0.5 V) for a TFT (L=25 μm, W=100 μm) fabricated from a PFDD/SWCNT solution on a CEP/PVP gate dielectric stack. Dashed curve is for sweeping the gate voltage from -3 V to +2 V and the solid curve is for reversing the direction of the gate voltage sweep.

TFTs were fabricated by deposition of Ti/Pd source and drain contacts on top of polyfluorene/SWCNT network formed on CEP/PVP dielectric stacks as described in Example 3. FIG. 7 shows a transfer curve of a representative TFT made in this way. From this transfer curve it is apparent that the device shows a high on-state current (>10 µA), good on/off ratio (>$10^5$), low operating voltage (<2 V) and low sub-threshold slope (about 200 mV/decade).

Example 5

Application to Different TFTs

Figure 8A:
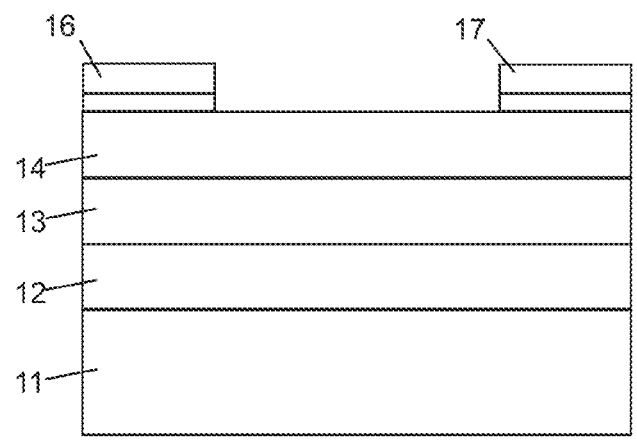
FIG. 8A depicts a bottom gate, top contacted thin film transistor (TFT) constructed with a semiconducting single-walled carbon nanotube (sc-SWCNT) layer and a cyanoethylated pullulan gate dielectric.
Figure 8B:
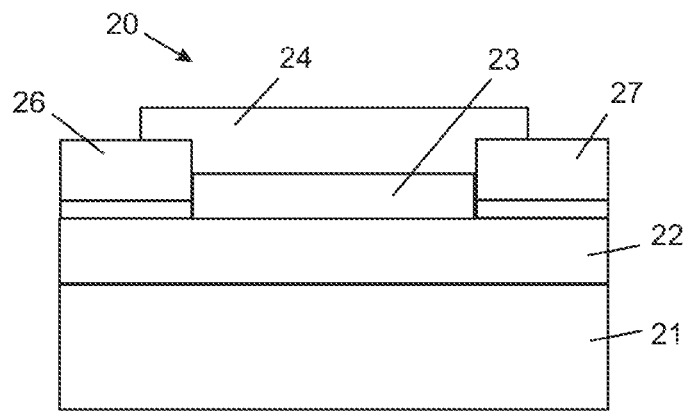
FIG. 8B depicts a bottom gate, bottom contacted thin film transistor (TFT) constructed with a semiconducting single-walled carbon nanotube (sc-SWCNT) layer and a cyanoethylated pullulan gate dielectric.
Figure 8C:
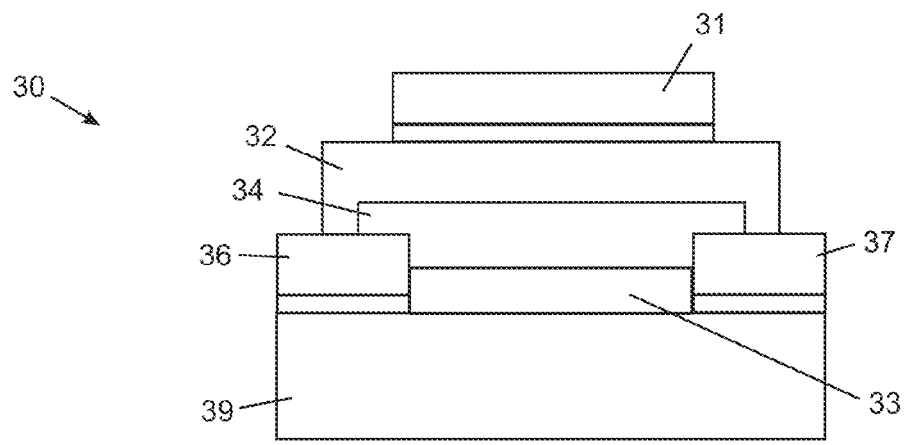
FIG. 8C depicts a top gate thin film transistor (TFT) constructed with a semiconducting single-walled carbon nanotube (sc-SWCNT) layer and a cyanoethylated pullulan gate dielectric.

With reference to FIG. 8A, FIG. 8B and FIG. 8C, bottom gate (FIG. 8A and FIG. 8B) and top gate (FIG. 8C) thin film transistors (TFTs) may be constructed comprising a semiconducting single-walled carbon nanotube (sc-SWCNT) layer and a cyanoethylated pullulan gate dielectric.

FIG. 8A depicts a bottom gate, top contacted TFT 10 comprising a doped silicon (Si) gate electrode 11 having deposited thereon a cyanoethylated pullulan gate dielectric film 12 with a thin layer of polyvinylphenol (PVP) employed as an adhesion layer between the cyanoethylated pullulan film 12 and the gate electrode 11. A film 13 of poly-L-lysine is supported on and cross-linked to the cyanoethylated pullulan film 12. A semi-conductive film 14 of sc-SWCNT is adhered to the film 13 of poly-L-lysine and a Ti—Au source electrode 16 and a Ti—Au drain electrode 17 are deposited on the film 14 of sc-SWCNT. The cyanoethylated pullulan gate dielectric film 12 separates the semiconductive film 14 of sc-SWCNT from the doped SiO$_2$ gate electrode 11.

FIG. 8B depicts a bottom gate, bottom contacted TFT 20 comprising a doped silicon (Si) gate electrode 21 having deposited thereon a cyanoethylated pullulan gate dielectric film 22 with a thin layer of polyvinylphenol (PVP)

employed as an adhesion layer between the cyanoethylated pullulan film 22 and the gate electrode 21. A film 23 of poly-L-lysine is supported on and cross-linked to the cyanoethylated pullulan film 22 between a Ti—Au source electrode 26 and a Ti—Au drain electrode 27, which are also supported on the cyanoethylated pullulan film 22. A semi-conductive film 24 of sc-SWCNT is supported on and adhered to the film 23 of poly-L-lysine and on the source and drain electrodes 26,27. In this arrangement, the electrodes 26,27 are at least partially between the semi-conductive film 24 and the gate electrode 21.

FIG. 8C depicts a top gate TFT 30 comprising a plastic substrate 39 (e.g. polyethylene terephthalate) for supporting other components of the TFT 30. A semi-conductive film 34 of sc-SWCNT is supported on and adhered to the substrate 39 through a film 33 of poly-L-lysine situated between a Ti—Au source electrode 36 and a Ti—Au drain electrode 37. The semi-conductive film 34 of sc-SWCNT is also partially supported on the electrodes 36,37 and the electrodes 36,37 are also deposited on the substrate 39. A metal (e.g. Al) gate electrode 31 is supported on and separated from the film 34 of sc-SWCNT by a gate dielectric 32 of cyanoethylated pullulan. The gate dielectric 32 is adhered to the gate electrode 31 by a thin layer of PVP and the film 34 of sc-SWCNT is adhered to the gate dielectric 32 by a cross-linker that cross-links the cyanoethylated pullulan to conjugated polymer enwrapping the sc-SWCNTs

REFERENCES

The contents of the entirety of each of which are incorporated by this reference.

Aguirre C M, Levesque P L, Paillet M, Lapointe F, St.-Antione B C, Desjardins P, Martel R. (2009) The Role of the Oxygen/Water Redox Couple in Suppressing Electron Conduction in Field-Effect Transistors. *Adv. Mater.* 21, 3087-3091.

Araumi M, Kawashima I, Murakami A, Yamaga T. (2009) Transistor Element, Display Device and These Manufacturing Methods. United States Patent Publication US 2009/0189148 published Jul. 30, 2009.

Bae M-j, Park S-h, Jeong T-w. (2012) Dielectric Paste Composition, Method of Forming Transparent Dielectric Layer, Transparent Dielectric Layer, and Device Including the Transparent Dielectric Layer. United States Patent Publication US 2012/0167799 published Jul. 5, 2012.

Cao Q, Kim H, Pimparkar N, Kulkarni J P, Wang C, Shim M, Roy K, Alam M A, Rogers J A. (2008) Medium scale carbon nanotube integrated circuits on flexible plastic substrates. *Nature.* 454, 495-500.

Cao Q, Rogers J A. (2009) Ultrathin films of single wall carbon nanotubes for electronics and sensors: A review of fundamental and applied aspects. *Adv. Mater.* 21, 29-53.

Ding J, Li Z, Lefebvre F, Cheng F, Dubey G, Zou S, Finnie P, Hrdina A, Scoles L, Lopinski G P, Kingston C T, Simard B, Malenfant P R L (2014) Enrichment of large-diameter semiconducting SWCNTs by polyfluorene extraction for high network density thin film transistors Nanoscale 6, 2328-2339.

Fang X, Tan D Q, Cao Y, Chen Q, Irwin P C. (2011) Dielectric Film, Associated Article and Method. United States Patent Publication US 2011/10075320 published Mar. 31, 2011.

Fukui I. (2007) Thin-Film Field-Effect Transistors and Making Method. U.S. Pat. No. 7,256,436 issued Aug. 14, 2007.

Gerstel P, Klumpp S, Hennrich F, Poschlad A, Meded V, Blasco E, Wenzel W, Kappes M M, Barner-Kowollik C. (2014) Highly Selective Dispersion of Single-Walled Carbon Nanotubes via Polymer Wrapping: A Combinatorial Study via Modular Conjugation. *ACS Macro Lett.* 3, 10-15, dx.doi.org/10.1021/mz400472q.

Ha M, Xia Y, Green A A, Zhang W, Renn M J, Kim C H, Hersam M C, Frisbie C D. (2010) Printed, sub-3V digital circuits on plastic from aqueous carbon nanotube inks. *ACS Nano.* 4388-4395.

Ha M, Seo J-W T, Prabhumirashi P L, Zhang W, Geier M L, Renn M J, Kim C H, Hersam M C, Frisbie C D. (2013) Aerosol jet printed, low voltage, electrolyte gated carbon nanotube ring oscillators with sub-5 μs stage delays. *Nano Lett.* 13, 954-960.

Hirai K. (2006) Thin-Film Transistor, Thin-Film Transistor Sheet and Their Manufacturing Method. U.S. Pat. No. 7,037,767 issued May 2, 2006.

Hur S H. (2010) Optimization of single wall carbon nanotube growth and study of the hysteresis of random network carbon nanotube thin film transistors. *Korean J. Chem Eng.* 27, 1892-1896.

Jin S H, Islam A E, Kim T, Kim J, Alam M A, Rogers J A. (2012) Sources of hysteresis in carbon nanotube field effect transistors and their elimination via methylsiloxane encapsulants and optimized growth procedures. *Adv. Funct. Mater.* 22, 2276-2284.

Jung S W, Baeg K J, Yoon S M, You I K, Lee J K, Kim Y S, Noh Y Y. (2010) Low-voltage-operated top-gate polymer thin-film transistors with high capacitance poly(vinylidene fluoride-trifluoroethylene)/poly(methyl methacrylate) dielectrics. *J. Appl. Phys.* 108, 102810.

Kim B, Jang S, Prabhumirashi P L, Geier M L, Hersam M C, Dodabalapur A. (2013) Low voltage, high performance inkjet printed carbon nanotube transistors with solution processed $ZrO_2$ gate insulator. *Appl. Phys. Lett.* 103, 082119.

Lau P H, Takei K, Wang C, Ju J, Kim J, Yu Z, Takahashi T, Cho G, Javey A. (2013) Fully printed, high performance carbon nanotube thin-film transistors on flexible substrates. *Nano Letters.* 13, 3864-3869.

Lau P H. (2013) Fully Printed, Flexible, High Performance Carbon Nanotube Top-gated Thin-film Transistors. Electrical Engineering and Computer Sciences University of California at Berkeley. Technical Report No. UCB/EECS-2013-63.

Lee C W, Pillai S K R, Luan X N, Wang Y L, Li C M, Chan-Park M B. *Small.* 8, 2941.

Lin D W, Bettinger C, Bao Z. (2010) Versatility of Poly-L-Lysine for Carbon Nanotube Network Film Coating. 2010 MRS Spring Meeting, Symposium R, R5.16 Abstract.

Machado W S, Hummelgen I A. (2012) Low-voltage poly (3-hexylthiophene)/poly(vinyl alcohol) field effect transistor and inverter. *IEEE Trans. Elec. Devices.* 59, 1529-1533.

Maruyama K, Chiba T, Takamizawa M. (1989) Film Capacitor. U.S. Pat. No. 4,843,517 issued Jun. 27, 1989.

Miyata Y, Shiozawa K, Asada Y, Ohno Y, Kitaura R, Mizutani T, Shinohara H. (2011) Length-sorted semiconducting carbon nanotubes for high-mobility thin film transistors. *Nano Res.* 4, 963-970.

Moon H-S, Kim J-M. (2009) Organic Thin Film Transistor and Method of Fabricating the Same. U.S. Pat. No. 7,537,975 issued May 26, 2009.

Okimoto H, Takenobu T, Yanagi K, Miyata Y, Shimontani H, Kataura H, Iwasa Y. (2010) Tunable carbon nanotube thin-film transistors produced exclusively via inkjet printing. *Adv. Mater.* 22, 3981-3986.
Onda Y, Muto H, Suzuki H. (1982) Cyanoethylpullulan. U.S. Pat. No. 4,322,524 issued Mar. 30, 1982.
Park S, Vosguerichin M, Bao Z. (2013) A review of fabrication and applications of carbon nanotube film-based flexible electronics. *Nanoscale.* 5, 1727-1752.
Rhee S W, Xu W. (2010) Method for Preparing a Polymer Gate Dielectric. Abstract of Korean Patent Publication KR 2010-0138078 published Dec. 31, 2010.
Roberts M E, LeMieux M C, Sokolov A N, Bao Z. (2009) Self-sorted nanotube networks on polymer dielectrics for thin-film transistors. *Nano Letters.* 9, 2526-2531.
Sato T. (2012) Substrate for Semiconductor Device Including an Island-Shaped Underlying Film Overlapping a Transistor, Method of Manufacturing the Same, Semiconductor Device And Electronic Device. U.S. Pat. No. 8,330,194 issued Dec. 11, 2012.
Seo M S, Lee H L. (2005) Dielectric properties of cyanoethylated polyvinyl alcohol. *TAPPI Journal.* 4(5), 23-26.
Shin H-j, Choi J-y, Ahn J-r, Jeon C-h. (2011) Semiconducting Graphene Composition, and Electrical Device Including the Same. United States Patent Publication US 2011/0309336 published Dec. 22, 2011.
Snow E S, Novak J P, Campbell P M, Park D. (2003) Random networks of carbon nanotubes as an electronic material. *Appl. Phys. Lett.* 82, 2145-2147.
Snow E S, Campbell P M, Ancona M G, Novak J P. (2005) High mobility carbon nanotube thin film transistors on a polymeric substrate. *Appl. Phys. Lett.* 86, 033105.
Sun D-M, Timmermans M Y, Tian Y, Nasibulin A G, Kauppinen E I, Kishimoto S, Mizutani T, Ohno Y. (2011) Flexible high performance carbon nanotube integrated circuits. *Nature Nanotechnology.* 6, 156-161.
Sun D-M, Timmermans M Y, Kaskela A, Nasibulin A G, Kishimoto S, Mizutani T, Kauppinen E I, Ohno Y. (2013) Mouldable all-carbon integrated circuits. *Nature Communications.*
Takahashi T, Takei K, Gillies A G, Fearing R S, Javey A. (2011) Carbon nanotube active-matrix backplanes for conformal electronics and sensors. *Nano Lett.* 11, 5408-5413.
Tseng S H, Tai N H. (2009) Fabrication of a transparent and flexible thin film transistor based on single wall carbon nanotubes using the direct transfer method. *Appl. Phys. Lett.* 95, 204104.
Wang C, Chien J C, Takei K, Takahashi T, Nah J, Niknejad A M, Javey A. (2012) Extremely bendable, high performance integrated circuits using semiconducting carbon nanotube networks for digital, analog and radio-frequency applications. *Nano Lett.* 12, 1527-1533.
Wang C, Takei T, Takahashi T, Javey A. (2013) Carbon nanotube electronics-moving forward. *Chem. Soc. Rev.* 42, 2592-2609.
Xu W, Rhee S-W. (2009) Low-operating voltage organic field effect transistors with high-k cross-linked cyanoethylated pullulan polymer gate dielectrics. *J. Mater. Chem.* 19, 5250-5257.
Xu W, Rhee S-W. (2010) Organic field-effect transistors with cross-lined high-k cyanothylated pulluan polymer as a gate insulator. *Organic Electronics.* 11(6), 996-1004.
Xu W, Guo C, Rhee S-W. (2012) Knitting up the inter-dipole gaps in dielectric surfaces; an efficient route for high performance organic field effect transistors. *J. Mater. Chem.* 22 6597-6602.
Xu W, Guo C, Rhee S-W. (2013) High performance organic field-effect transistors using cyanoethyl pullulan (CEP) high-k polymer cross-linked with trimethylolpropane triglycidyl ether (TTE) at low temperatures. *J. Mater. Chem. C.* 1, 3955-3960.
Yoon M-H, Yan H, Facchetti A, Marks T J. (2005) Low voltage organic field effect transistors and inverters enabled by ultrathin cross-linked polymers as gate dielectrics. *J. Am. Chem. Soc.* 127, 10388-10395.
Zheng Y, Quinn J, Yan H, Hu Y, Lu S, Facchetti A. (2013) Dielectric Materials and Methods of Preparation and Use Thereof. U.S. Pat. No. 8,580,384 issued Nov. 12, 2013.

The novel features will become apparent to those of skill in the art upon examination of the description. It should be understood, however, that the scope of the claims should not be limited by the embodiments, but should be given the broadest interpretation consistent with the wording of the claims and the specification as a whole.

What is claimed is:

1. A thin film transistor comprising: a gate electrode; a gate insulation layer comprising a cyanoethylated polyhydroxy polymer cross-linked by a cross-linker and adhered to the gate electrode; a polymeric material that reacts or interacts with the gate insulation layer; a semiconducting channel comprising a network of semiconducting carbon nanotubes adhered to the polymeric material and separated from the gate electrode by the gate insulation layer; a source electrode; and, a drain electrode wherein the polymeric material comprises a layer of a polyamino acid, a polymer with a pendant amine group, a polymer with a pendant amino silane group, a polyvinylphenol or any blend thereof, between the gate insulation layer and the semiconducting channel.

2. The thin film transistor according to claim 1, wherein the cyanoethylated polyhydroxy polymer comprises a cyanoethylated pullulan.

3. The thin film transistor according to claim 2, wherein the cyanoethylated pullulan comprises cyanoethyl pullulan or cyanoethyl dihydroxypropyl pullulan (CEDHPP).

4. The thin film transistor according to claim 1, wherein the cross-linker comprises ethylenediaminetetraacetic dianhydride (EDT), benzophenone-3,3',4,4'-tetracarboxylic dianhydride (BPT), diethylenetriaminepentaaceticdianhydride (DAPD), biphenyl-4,4'-dicarboxylic acid (BCA), suberoyl chloride or any mixture thereof.

5. The thin film transistor according to claim 1, wherein the polymeric material comprises a layer of a polyamino acid between the gate insulation layer and the semiconducting channel.

6. The thin film transistor according to claim 1, wherein the polymeric material comprises a layer of poly-L-lysine between the gate insulation layer and the semiconducting channel.

7. The thin film transistor according to claim 1, wherein the polymeric material comprises a conjugated polymer modifying the carbon nanotubes.

8. The thin film transistor according to claim 1, wherein the gate insulation layer comprises an adherence layer between the gate insulation layer and the gate electrode to provide greater adherence of the gate insulation layer to the gate electrode.

9. The thin film transistor according to claim 1, wherein the gate insulation layer comprises a blend of the polyhydroxy polymer and an adherence aid.

10. The thin film transistor according to claim 1, wherein the semiconducting carbon nanotubes comprise semiconducting single-walled carbon nanotubes (sc-SWCNTs).

11. The thin film transistor according to claim 1 exhibiting a mobility of greater than 10 $cm^2/Vs$, an on/off ratio of about $10^4$ or greater, a hysteresis of about 2 V or less, or any combination thereof.

12. A method of producing the thin film transistor as claimed in claim 1, the method comprising assembling the gate electrode, the gate insulation layer, the semiconducting channel, the source electrode and the drain electrode into the thin film transistor, wherein the semiconductor channel is adhered to the gate insulation layer through a polymeric material, the polymeric material reacting or interacting with the gate insulation layer, the gate insulation layer comprising a cross-linked cyanoethylated polyhydroxy polymer, and the semiconductor channel comprising a network of semiconducting carbon nanotubes adhered to the polymeric material and separated from the gate electrode by the gate insulation layer.

13. The method according to claim 12, wherein the cross-linked cyanoethylated polyhydroxy polymer is produced by cross-linking a cyanoethylated polyhydroxy polymer with a cross-linker comprising ethylenediaminetetraacetic dianhydride (EDT), benzophenone-3,3',4,4'-tetracarboxylic dianhydride (BPT), diethylenetriaminepentaaceticdianhydride (DAPD), biphenyl-4,4'-dicarboxylic acid (BCA), suberoyl chloride or any mixture thereof.

14. The method according to claim 12, wherein the polymeric material comprises a layer of poly-L-lysine between the gate insulation layer and the semiconducting channel.

15. The method according to claim 12, wherein the cross-linked cyanoethylated polyhydroxy polymer comprises a cross-linked cyanoethylated pullulan.

16. The method according to claim 12, wherein the semiconducting carbon nanotubes comprise semiconducting single-walled carbon nanotubes (sc-SWCNTs), and wherein the cyanoethylated polyhydroxy polymer comprises cyanoethyl pullulan or cyanoethyl dihydroxypropyl pullulan (CEDHPP).

17. The method according to claim 12, wherein the polymeric material comprises a conjugated polymer modifying the carbon nanotubes.

* * * * *